(12) United States Patent
Atanakovic et al.

(10) Patent No.: US 7,538,016 B2
(45) Date of Patent: May 26, 2009

(54) SIGNAL AND/OR GROUND PLANES WITH DOUBLE BURIED INSULATOR LAYERS AND FABRICATION PROCESS

(75) Inventors: Petar B. Atanakovic, Palo Alto, CA (US); Michael Lebby, Apache Junction, AZ (US)

(73) Assignee: Translucent, Inc., Palo Alto, CA (US)

( * ) Notice: Subject to any disclaimer, the term of this patent is extended or adjusted under 35 U.S.C. 154(b) by 0 days.

(21) Appl. No.: 11/961,938

(22) Filed: Dec. 20, 2007

(65) Prior Publication Data

US 2008/0093670 A1  Apr. 24, 2008

Related U.S. Application Data

(62) Division of application No. 11/121,737, filed on Apr. 29, 2005, now Pat. No. 7,323,396.

(51) Int. Cl.
*H01L 21/20* (2006.01)
*H01L 21/44* (2006.01)
*H01L 23/48* (2006.01)

(52) U.S. Cl. .................. 438/584; 438/682; 438/655; 257/754; 257/757

(58) Field of Classification Search ............. 438/584, 438/682, 655, 755; 257/754, 757
See application file for complete search history.

(56) References Cited

U.S. PATENT DOCUMENTS

| 5,387,555 | A | * | 2/1995 | Linn et al. | .............. | 438/455 |
| 5,798,297 | A | * | 8/1998 | Winnerl et al. | .............. | 438/622 |
| 2002/0151158 | A1 | * | 10/2002 | Cabral et al. | .............. | 438/583 |
| 2004/0056243 | A1 | * | 3/2004 | Atanackovic et al. | .............. | 257/19 |

* cited by examiner

*Primary Examiner*—Michael Trinh
(74) *Attorney, Agent, or Firm*—Parsons & Goltry; Robert A. Parsons; Michael W. Goltry

(57) ABSTRACT

The present invention describes a method including the steps of providing a single crystal semiconductor substrate, forming a layer of rare earth silicide on a surface of the semiconductor substrate, forming a first layer of insulating material on the layer of rare earth silicide, forming a layer of electrically conductive material on the first layer of insulating material, and forming a second layer of insulating material on the layer of electrically conductive material. In one embodiment the step of forming the layer of rare earth silicide includes depositing a layer of rare earth metal on a surface of the semiconductor substrate depositing a layer of insulating material on the layer of rare earth metal, and annealing the structure to form a layer of rare earth silicide in conjunction with the surface of the semiconductor substrate and a rare earth doped insulating layer in conjunction with the layer of insulating material.

7 Claims, 3 Drawing Sheets

SIGNAL AND/OR GROUND PLANES WITH DOUBLE BURIED INSULATOR LAYERS AND FABRICATION PROCESS

CROSS REFERENCE TO RELATED APPLICATIONS

This application is a divisional application of U.S. patent application Ser. No. 11/121,737, filed 29 Apr. 2005, now U.S. Pat. No. 7,323,396.

FIELD OF THE INVENTION

This invention relates to signal and/or ground planes in semiconductor circuits, and also to double buried insulator layers, and to fabrication processes.

BACKGROUND OF THE INVENTION

Complimentary metal oxide semiconductor (CMOS) structures are the core active elements of modern electronics. Undoubtedly, the major material enabling features of Si CMOS are the superb quality of the native silicon dioxide ($SiO_2$), $Si/SiO_2$ interface and high crystalline perfection of the Si substrates. The field effect transistor (FET) implemented as CMOS is scalable. That is, speed and complexity improves with decreasing device feature sizes. This concept makes CMOS architecture a powerful methodology. Deep submicron room-temperature bulk Si CMOS is presently the main technology used for ultra large scale integrated circuits (ULSICs).

Because silicon is the major semiconductor material used in the semiconductor industry, silicon dioxide ($SiO_2$) is the major insulating material used in the gate insulating layer. Silicon dioxide is a natural material that can be easily grown thermally through a steam process. Also, the silicon dioxide forms a bond with the crystalline silicon active layer that determines most of the characteristics of the FET so that it is very difficult to change the insulating material of the gate insulating layer without having deleterious effects on the FET.

Also, in the construction and design of many components it is desirable to form spaced and generally buried conductive layers in or on the substrate. These conductive layers can be used to form various components, e.g. capacitors, inductors, etc. Further, in many circuits it is desirable to form signal planes and ground planes that can be used, for example, throughout an entire integrated circuit. Also, in many FETs it is desirable to form a second, buried gate below the active channel. It has been shown that the double gate structure reduces short channel effects and parasitic capacitance in field effect transistors so that they can be scaled further (i.e. thinner and shorter channels) than bulk-Si. The buried conductive layers are useful in fabricating double gate FETs.

Clearly, one of the major problems that arises in prior art attempts to fabricate signal planes and ground planes is the formation of a buried conductive layer. In the semiconductor industry, forming a good conducting layer below, for example, crystalline or single crystal silicon is virtually unknown. One of the most common conductive buried layers includes heavily doped silicon areas, which is undesirable because free doping material has a tendency to migrate and corrupt other components, thereby shortening the life of the device and changing various characteristics (e.g. the threshold voltage). Also, heavily doped areas do not have good conductivity, thereby producing poor gate material, as well as poor signal and/or ground planes.

It would be highly advantageous, therefore, to remedy the foregoing and other deficiencies inherent in the prior art.

Accordingly, it is an object of the present invention to provide a new and improved method of fabricating one or more buried conductive layers and one or more associated insulator layers on a silicon substrate.

It is another object of the present invention to provide a new and improved structure including one or more buried conductive layers and one or more associated insulator layers on a silicon substrate.

Another object of the invention is to provide a new and improved method of fabricating signal and/or ground planes.

Another object of the invention is to provide a new and improved method of fabricating multiple box (buried oxide) layers.

A further object of the present invention is to provide new and improved buried conductive layers and insulator layers, and fabrication processes, that can be easily integrated into present day semiconductor circuits and manufacturing processes.

SUMMARY OF THE INVENTION

Briefly, to achieve the desired objects of the instant invention in accordance with a preferred embodiment thereof, provided is a method including the steps of providing a single crystal semiconductor substrate, forming a layer of rare earth silicide on a surface of the semiconductor substrate, forming a first layer of insulating material on the layer of rare earth silicide, forming a layer of electrically conductive material on the first layer of insulating material, and forming a second layer of insulating material on the layer of electrically conductive material. In one embodiment the step of forming the layer of rare earth silicide includes depositing a layer of rare earth metal on a surface of the semiconductor substrate depositing a layer of insulating material on the layer of rare earth metal, and annealing the structure to form a layer of rare earth silicide in conjunction with the surface of the semiconductor substrate and a rare earth doped insulating layer in conjunction with the layer of insulating material.

To further achieve desired objects of the instant invention in accordance with a preferred embodiment thereof, provided is a structure including one or more buried conductive layers and one or more associated insulator layers on a semiconductor substrate. The structure includes a single crystal semiconductor substrate, a layer of rare earth silicide on a surface of the semiconductor substrate, a first layer of insulating material on the layer of rare earth silicide, a layer of electrically conductive material on the first layer of insulating material, and a second layer of insulating material on the layer of electrically conductive material. An active semiconductor layer is positioned on the second layer of insulating material and an electronic component is formed in the active semiconductor layer. The electronic component can be an active device, such as a FET, or an inactive component, such as a capacitor or inductor can be formed using the two buried conductive layers. Also, the two buried conductive layers can be used as signal plane and ground plane in conjunction with an integrated circuit.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF A PREFERRED EMBODIMENT

Figure 1:
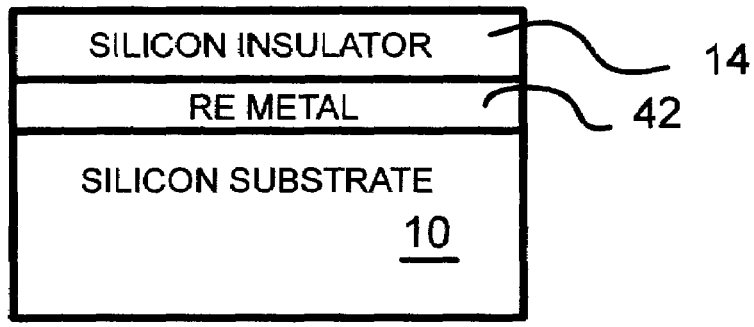
FIGS. 1 through 3 are simplified sectional views illustrating a series of steps in a fabrication process for a conductive buried layer in accordance with the present invention.

Turning now to the drawings, attention is first directed to FIG. 1, which illustrates a simplified sectional view illustrating an initial step in a fabrication process for improved conductive buried layers in accordance with the present invention. A substrate 10 is provided which, under normal manufacturing procedures, is a single crystal silicon wafer, although any size substrate, wafer, or portion of a wafer could be used in the following procedures, (all of which come within the term 'substrate' as used in this disclosure) if desired. Also, it will be understood by those skilled in the art that the terms 'single crystal' and 'crystalline' are interchangeable and may be used interchangeably in the present discussion.

A layer 12 of rare earth metal is deposited directly on the surface of substrate 10 by any of a variety of methods. While any of the materials known as 'rare earths' can be used, two preferred examples are Erbium (Er) and Ytterbium (Yb). Other typical examples of rare earth materials that can be used in this application are described in a copending U.S. patent application entitled "Rare Earth-Oxides, Rare Earth-Nitrides, Rare Earth-Phosphides and Ternary Alloys With Silicon", filed on Dec. 28, 2004, and bearing application Ser. No. 11/025,681, which is a conversion of U.S. provisional application No. 60/533,378, filed 29 Dec. 2003 and bearing the same title, incorporated herein by reference.

A layer 14 of insulating material is formed on the surface of rare earth metal layer 12. In this preferred embodiment insulating layer 14 is a silicon insulating layer and the silicon insulating material can be any of silicon oxide, silicon dioxide, silicon nitride, silicon oxynitride, etc., all of which come within the generic term 'silicon insulating material' as used herein. The process of forming layer 14 can use any standard deposition (growing) procedure (e.g. CVD, TEOS, plasma, sputtered, etc.).

Figure 2:
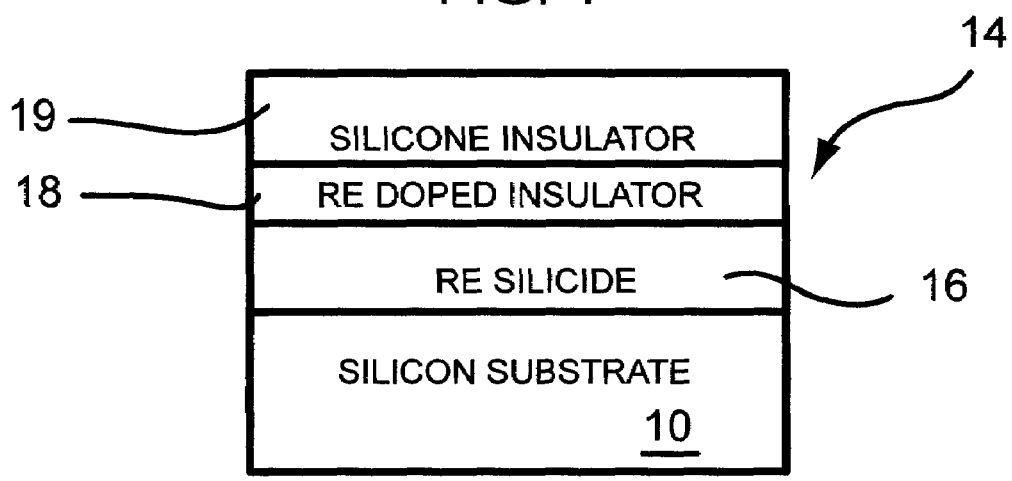

Referring additionally to FIG. 2, in this preferred embodiment, the structure of FIG. 1 is annealed so that the rare earth metal of layer 12 is annealed with the pure silicon of substrate 10 to form a layer of rare earth silicide, designated 16. Rare earth silicide layer 16 can be formed in a variety of other methods, only one of which is to deposit a layer of the rare earth on the surface of substrate 10 and then anneal the rare earth with the pure silicon to form a thin layer of rare earth silicide. It will be understood that rare earth silicides are essentially metal and are good electrical conductors. All of the conductive materials formed from any of the above described rare earths are referred to in this disclosure generally as "rare earth silicides" or as "rare earth conductive material".

In this preferred embodiment, annealing rare earth metal layer 12 with silicon insulator layer 14 deposited thereon has the additional advantage that a layer 18 of rare earth doped insulator material is formed adjacent rare earth silicide layer 16. The remaining portion of layer 14 is generally a layer of silicon insulator, designated 19. Generally, the rare earth doped insulator material of layer 18 forms a better insulator and also tends to match the insulator and conductor to produce less strain between layers. The amount of rare earth doping that occurs in layer 18 and the thickness of layer 18 can determine the strain in layer 18 and the remaining portion of layer 14, i.e. layer 19. Here it should be understood that layers 18 and 19 can be formed with any desired thickness, depending upon the strain or strain relief desired, and the rare earth doping could actually extend completely through layer 14 (i.e. layer 19 would not appear). Thus, the annealing process can be used, to some extent, to tune the strain in the overall structure. Strain tuning is described in detail in a copending U.S. patent application entitled "Semiconductor-On-Insulator Silicon Wafer", filed on 9 Feb. 2005, bearing Ser. No. 11/054,579, and incorporated herein by reference.

Figure 3:
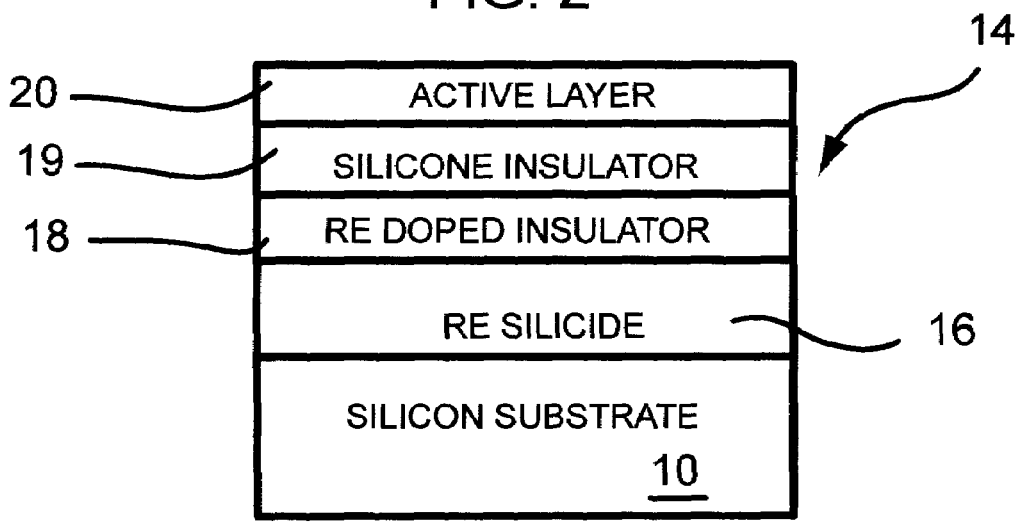

Referring additionally to FIG. 3, in this specific embodiment, an active layer 20, generally formed of single crystal silicon, is positioned on the surface of silicon insulator 19. In this embodiment layer 20 can be formed using any of a variety of different methods, such as by wafer bonding, as described in the above referenced copending patent application. As understood by those skilled in the art, wafer bonding generally incorporates an anneal step to complete the bonding process. In the procedure of this invention, the anneal process used in the wafer bonding can be the same anneal used to convert the rare earth metal and silicon to rare earth silicide. By tuning the strain in rare earth doped layer 18 and silicon insulator layer 19, the amount of strain in active layer 20 can be adjusted to any desired amount, including substantially zero.

Figure 4:
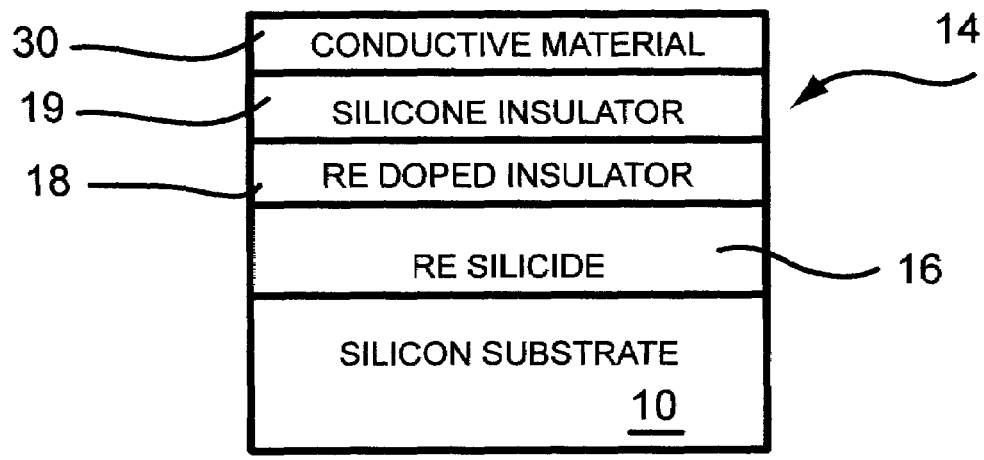
FIG. 4 is a simplified sectional view illustrating a step in an alternative fabrication process for forming multiple conductive buried layers.

Turning now to FIG. 4, another embodiment is illustrated in which the basic structure of FIG. 2 is used. In this embodiment, a conducting layer 30 is deposited on the upper surface of silicon insulator layer 19. Conducting layer 30 can be any conducting material including a simple metallization process or even a layer of copper. Here it will be understood that copper has a tendency to contaminate later performed processes and will generally, therefore, be performed at the latest possible step in the process. In association with the above understanding, those skilled in the art will also understand that the various steps described are not necessarily performed in the sequence described.

Figure 5:
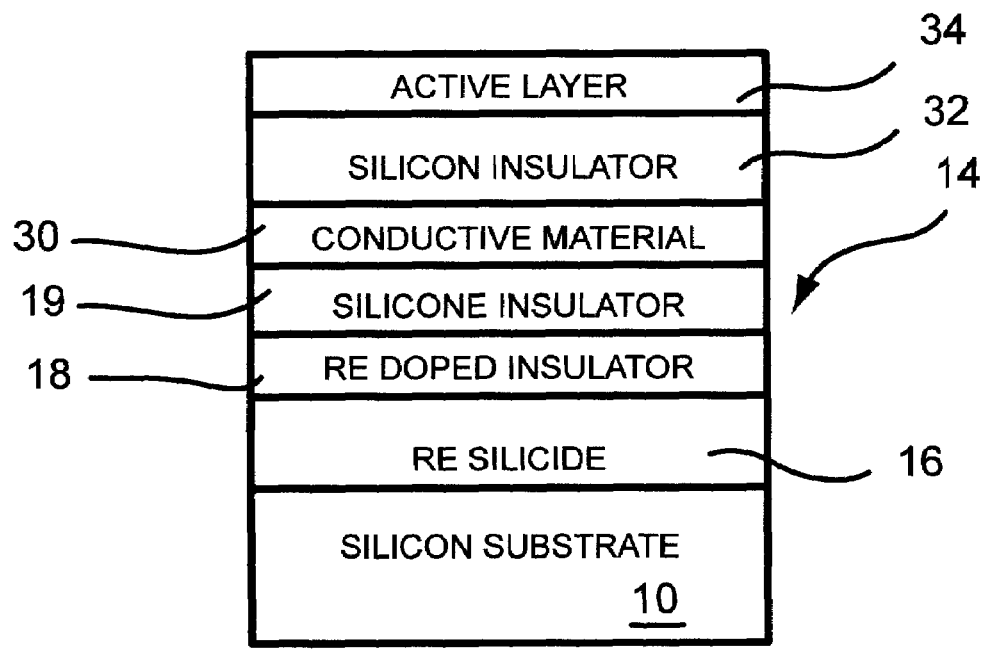
FIG. 5 is a simplified sectional view illustrating additional steps in a fabrication process for multiple conductive buried layers and associated insulator layers, in accordance with the present invention.

Referring additionally to FIG. 5, a layer 32 of silicon insulating material is formed on the surface of conducting layer 30. The silicon insulating material can be any of silicon oxide, silicon dioxide, silicon nitride, silicon oxynitride, etc., all of which come within the generic term 'silicon insulating material' as used herein. The process of forming layer 32 can use any standard deposition (growing) procedure (e.g. CVD, TEOS, plasma, sputtered, etc.). An active layer 34, generally formed of single crystal silicon, is positioned on the surface of silicon insulator 32. In this embodiment layer 34 can be deposited using any of a variety of different methods, such as by wafer bonding, as described in the above referenced copending patent application.

In a different fabrication process from that described above and still referring to FIG. 5, rare earth silicide layer 16 can be deposited directly as a single crystal layer. A single crystal layer of rare earth insulating material (rare earth oxide, nitride, oxynitride, etc.) can be epitaxially grown on the surface of rare earth silicide layer 16 as insulator layer 14. Because layer 16 is a single crystal material, layer 14 of rare earth insulating material can be epitaxially grown directly thereon as a single crystal material and can be closely lattice matched thereto. All of the above described rare earth materials formed as single crystal electrically insulating material (e.g. rare earth oxide, rare earth nitride, rare earth oxynitride, etc.) are referred to in this disclosure generally as "rare earth electrical insulators" or as "rare earth electrically insulating materials".

Because insulating layer 14 is a single crystal rare earth electrical insulator, a rare earth silicide or other rare earth conductive material can be deposited directly on the surface as single crystal conducting layer 30. A single crystal layer of rare earth insulating material (rare earth oxide, nitride, oxynitride, etc.) can be epitaxially grown on the surface of conducting layer 30 as insulator layer 32. Because conducting layer 14 is a single crystal material, insulator layer 32 of rare earth insulating material can be epitaxially grown directly thereon as a single crystal material and can be closely lattice matched thereto. Active layer 34, generally formed of single crystal silicon, can be, for example epitaxially deposited directly on the surface of insulator layer 32. In this embodiment layer 34 can be deposited as single crystal silicon because insulator layer 32 is a single crystal material and can be closely lattice matched thereto.

It will be noted by those skilled in the art that at this point rare earth silicide layer 16 and conducting layer 30 are buried conductive layers and the structure can be used for a variety of different applications. Also, additional buried conductive layers and buried insulator layers can be incorporated, if desired, using any of the techniques described above. As a typical example of one use for the buried insulator/conductor structure, rare earth silicide layer 16 can be used as a ground plane in an integrated circuit and conducting layer 30 can be used as a signal plane. It is known in the art that such ground and signal planes can be used to greatly enhance performance of integrated circuits and the like. Also, structures similar to these can be specifically designed to act as components (e.g. spaced apart plates) in various inactive electrical components, such as capacitors, inductors, etc.

Figure 6:
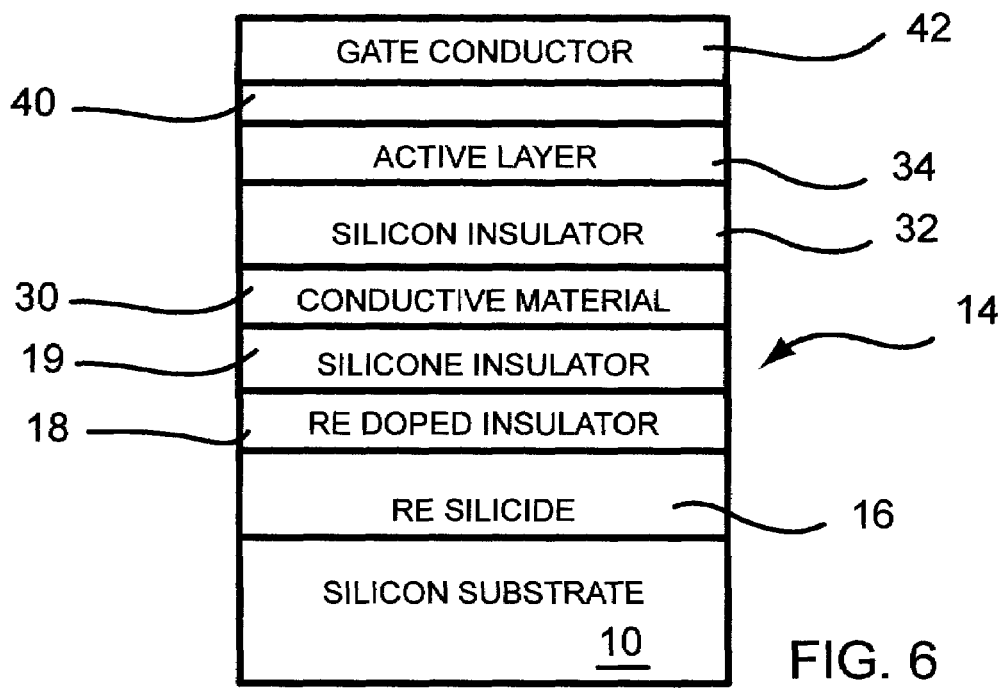
FIGS. 6 and 7 illustrate additional steps in a field effect transistor fabrication process in accordance with the present invention.

As another typical example of a use for the buried insulator/conductor structure of FIG. 5 and referring additionally to FIG. 6, a thin gate insulator layer 40 is deposited on the surface of active layer 34. A gate conductor 42, which may be one or more layers of doped silicon or the like are deposited on gate insulator layer 40. It will be understood that layers 40 and 42 can be deposited by any well known technique and will usually include silicon insulating material, when active layer 34 is single crystal silicon.

Figure 7:
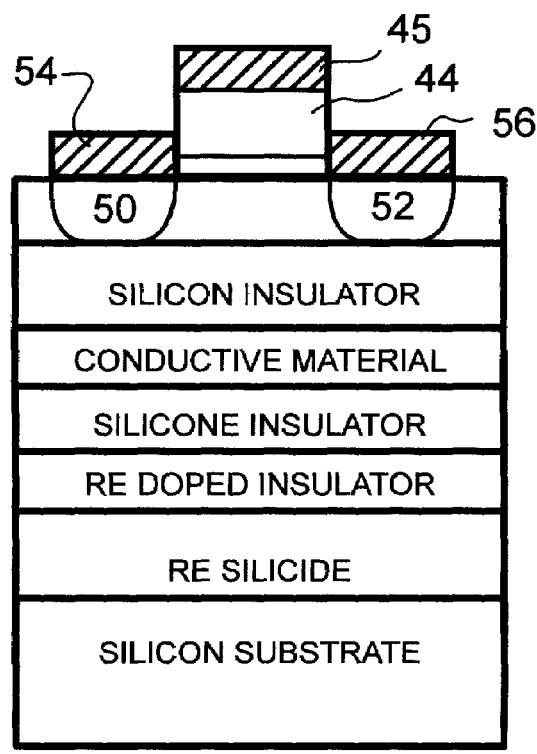

Referring additionally to FIG. 7, the structure on substrate 10 can be patterned and etched to define upper gate structure 44 and then metalized to form electrical contact 45. Alternatively, the structure on substrate 10 can be patterned and metalized and then etched using the metallization as a pattern. Other fabrication variations can be devised but the result is upper gate structure 44 including gate insulating layer 40, gate conductor 42, and gate metal contact 45 as illustrated. A semiconductor component, such as a FET, can be completed in active layer 34 by simply forming a source and a drain in some convenient process, as illustrated in FIG. 7. For example, a source 50 and a drain 52 can be formed by diffusion or implanting of a selected dopant material into the areas at either side of upper gate structure 44. Electrical contacts 54 and 56 can then be formed by any well known metallization process.

A more thorough explanation of an improved gate stack and gate structure is contained in a copending United States patent application entitled "FET Gate Structure and Fabrication Process", filed Feb. 28, 2005 bearing Ser. No. 11/068, 222, and incorporated herein by reference. Also, the buried insulator/conductor structure of FIG. 5 can be used as a basis to fabricate a double gate FET, described in detail in copending United States patent application entitled "Double Gate FET and Fabrication Process", filed Mar. 18, 2005, bearing Ser. No. 11/084,486 (applicant's docket number 4573-A7, and incorporated herein by reference.

Thus, a new and improved method of fabricating one or more buried conductive layers and one or more associated insulator layers on a silicon substrate is disclosed. Also, the new and improved method fabricates a new and improved structure including one or more buried conductive layers and one or more associated insulator layers on a silicon substrate. The new and improved structure can be used in the further fabrication of signal and/or ground planes, integrated circuits using the signal and/or ground planes, FETs, double gate FETs, and various inactive electrical components. The new and improved structure further provides multiple box (buried oxide) layers for additional protection from leakage and the like. Further, the new and improved buried conductive layers and insulator layers, and fabrication processes, can be easily integrated into present day semiconductor circuits and manufacturing processes.

Various changes and modifications to the embodiment herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

The invention claimed is:

1. A method of fabricating a structure including one or more buried conductive layers and one or more associated insulator layers on a semiconductor substrate comprising the steps of:

providing a single crystal semiconductor substrate;

forming a layer of rare earth silicide on a surface of the semiconductor substrate;

forming a first layer of rare earth insulating material on the layer of rare earth silicide;

forming a layer of electrically conductive material on the first layer of insulating material;

forming a second layer of insulating material on the layer of electrically conductive material;

forming an active semiconductor layer on the second layer of insulating material; and each of the forming steps including epitaxially depositing single crystal material.

2. A method of fabricating a structure including one or more buried conductive layers and one or more associated insulator layers on a semiconductor substrate comprising the steps of:

providing a single crystal semiconductor substrate;

forming a layer of rare earth silicide on a surface of the semiconductor substrate and a first layer of rare earth doped insulating material on the layer of rare earth silicide including depositing a layer of rare earth metal on a surface of the semiconductor substrate, depositing a layer of insulating material on the layer of rare earth metal, and annealing the structure to form a layer of rare earth silicide in conjunction with the surface of the semiconductor substrate and a rare earth doped insulating layer in conjunction with the layer of insulating material;

forming a layer of electrically conductive material on the first layer of insulating material; and forming a second layer of insulating material on the layer of electrically conductive material.

3. A method as claimed in claim 2 including an additional step of positioning an active semiconductor layer on the second layer of insulating material.

4. A method as claimed in claim 3 wherein the step of positioning an active semiconductor layer on the second layer of insulating material includes wafer bonding.

5. A method as claimed in claim 4 wherein the wafer bonding includes an annealing step and the step of annealing the structure to form the layer of rare earth silicide and the rare earth doped insulating layer is performed simultaneously with the annealing step in the wafer bonding.

6. A structure including one or more buried conductive layers and one or more associated insulator layers on a semiconductor substrate comprising:

a single crystal semiconductor substrate having a surface;

a ground plane including a layer of rare earth silicide positioned on the surface of the semiconductor substrate;

a first layer of insulating material positioned on the layer of rare earth silicide;

a signal plane including a layer of electrically conductive material positioned on the first layer of insulating material;

a second layer of insulating material on the layer of electrically conductive material;

an active semiconductor layer positioned on the second layer of insulating material; and an integrated circuit formed on the active semiconductor layer.

7. A structure as claimed in claim 6 wherein the single crystal semiconductor substrate includes a silicon substrate, the layer of rare earth silicide includes single crystal rare earth silicide, the first layer of insulating material includes single crystal silicon insulating material, the layer of electrically conductive material includes single crystal rare earth conducting material, and the second layer of insulating material includes single crystal silicon insulating material.

* * * * *